United States Patent
Watanabe et al.

(10) Patent No.: US 9,588,772 B2
(45) Date of Patent: Mar. 7, 2017

(54) MEMORY CONTROLLER AND DECODING METHOD

(71) Applicant: Kabushiki Kaisha Toshiba, Minato-ku (JP)

(72) Inventors: Daiki Watanabe, Yokohama (JP); Daisuke Fujiwara, Yokohama (JP); Ryo Yamaki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 75 days.

(21) Appl. No.: 14/743,061

(22) Filed: Jun. 18, 2015

(65) Prior Publication Data

US 2016/0246603 A1 Aug. 25, 2016

Related U.S. Application Data

(60) Provisional application No. 62/118,810, filed on Feb. 20, 2015.

(51) Int. Cl.
*H03M 13/03* (2006.01)
*G06F 9/30* (2006.01)

(52) U.S. Cl.
CPC ........ *G06F 9/30145* (2013.01); *G06F 9/3001* (2013.01); *G06F 9/3004* (2013.01)

(58) Field of Classification Search
CPC .................................................. H03M 13/03
See application file for complete search history.

(56) References Cited

U.S. PATENT DOCUMENTS

| 6,668,026 B1 | 12/2003 | Miyauchi |
| 8,112,689 B2 | 2/2012 | Hong et al. |
| 8,631,306 B2 | 1/2014 | Lee et al. |
| 2002/0147954 A1* | 10/2002 | Shea ................... H03M 13/098 714/755 |

(Continued)

FOREIGN PATENT DOCUMENTS

| JP | 2000-341140 | 12/2000 |
| JP | 2002-198931 | 7/2002 |

(Continued)

OTHER PUBLICATIONS

Marc P.C. Fossorier, et al., "Soft-Decision Decoding of Linear Block Codes Based on Ordered Statistics", IEEE Transactions on Information Theory, vol. 41 (5), 1995, pp. 1379-1396.

*Primary Examiner* — M. Mujtaba Chaudry
(74) *Attorney, Agent, or Firm* — Oblon, McClelland, Maier & Neustadt, L.L.P.

(57) ABSTRACT

According to one embodiment, a memory controller includes a decoder configured to perform approximate maximum likelihood decoding, the decoder including: an initial value generation unit configured to calculate first data on the basis of a received word read from a non-volatile memory; a storage unit configured to store the first data and a predetermined number of second data; an update unit configured to calculate new second data by using the predetermined number of second data stored and update the storage unit; an arithmetic unit configured to output an addition result of the first data and the latest second data as decoded word information; and a selection unit configured to select a decoded word with the maximum likelihood on the basis of a plurality of the decoded word information.

20 Claims, 6 Drawing Sheets

(56) References Cited

U.S. PATENT DOCUMENTS

| | | | | |
|---|---|---|---|---|
| 2003/0093740 | A1* | 5/2003 | Stojanovic | H03M 13/03 714/752 |
| 2007/0288833 | A1* | 12/2007 | Djurdjevic | G11B 20/10009 714/784 |
| 2010/0253555 | A1* | 10/2010 | Weingarten | G06F 11/1068 341/51 |
| 2013/0128876 | A1* | 5/2013 | Kilian | H03M 13/6306 370/347 |
| 2014/0325237 | A1* | 10/2014 | Van Der Leest | G06F 21/72 713/189 |

FOREIGN PATENT DOCUMENTS

| | | |
|---|---|---|
| JP | 2008-165805 | 7/2008 |
| JP | 2011-176825 | 9/2011 |

\* cited by examiner

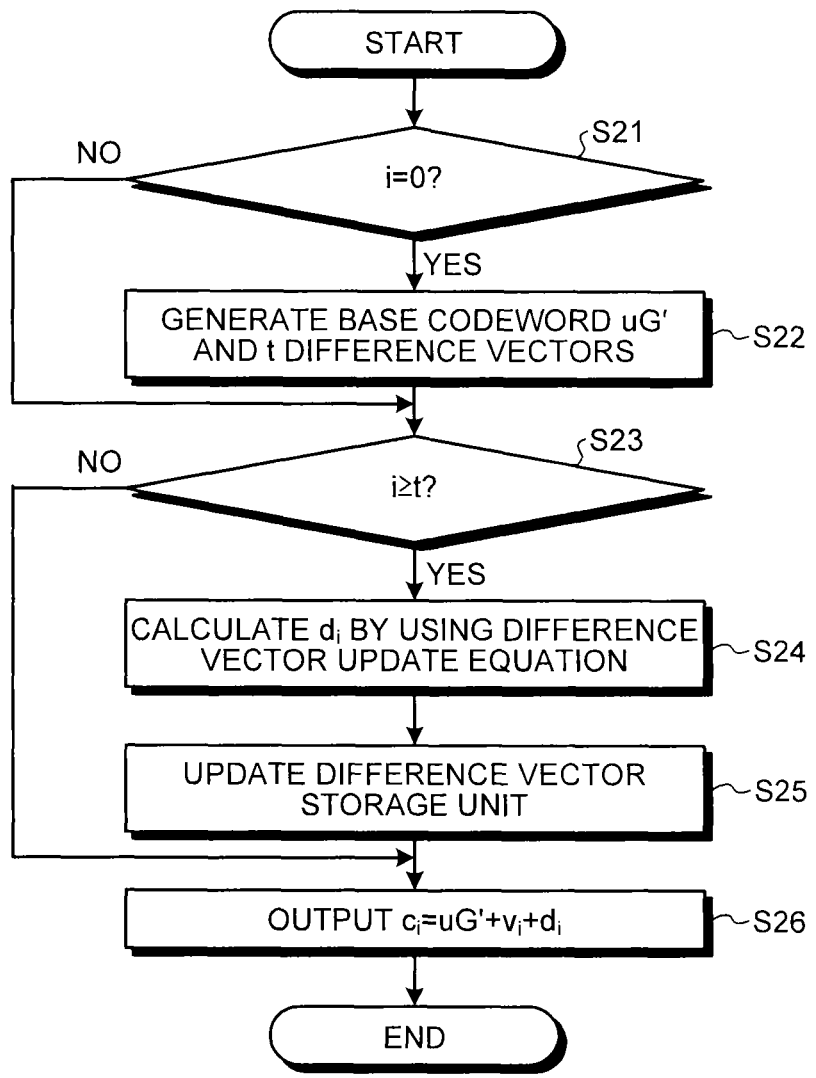

MEMORY CONTROLLER AND DECODING METHOD

CROSS-REFERENCE TO RELATED APPLICATIONS

This application is based upon and claims the benefit of priority from U.S. Provisional Application No. 62/118,810, filed on Feb. 20, 2015; the entire contents of which are incorporated herein by reference.

FIELD

Embodiments described herein relate generally to a memory controller and a decoding method.

BACKGROUND

A storage device normally performs error correction coding on data to be stored therein in order to protect the data. A Maximum Likelihood Decoding (MLD) is a method of decoding a codeword that is error correction coded, the method using a received word to find, from a whole set of codewords, a decoded word with the maximum likelihood that is a codeword having the highest probability to be the one from which the received word is generated. The MLD involves a large amount of computation, however. Therefore, a near MLD is used in some cases to find, not from the whole set of codewords but from a subset of codewords, the codeword having the highest probability to be the one from which the received word is generated.

BRIEF DESCRIPTION OF THE DRAWINGS

FIG. 10 is a flowchart illustrating an example of a codeword generation procedure according to the embodiment.

DETAILED DESCRIPTION

According to the present embodiment, a memory controller includes a decoder configured to perform approximate maximum likelihood decoding of a linear code, where the decoder includes: a generation unit configured to output a plurality of decoded word information on the basis of a received word read from a non-volatile memory; the each decoded word information uniquely identifying each decoded word to be a candidate for a decoded result of the received word and a selection unit configured to select a decoded word with the maximum likelihood from among a plurality of decoded words. The generation unit includes: an initial value generation unit configured to calculate first data on the basis of the received word; a storage unit configured to store the first data and a predetermined number of second data; an update unit configured to calculate new second data by using the predetermined number of second data stored in the storage unit and update the predetermined number of second data stored in the storage unit with the new second data; and an arithmetic unit configured to output an addition result of the first data and the latest second data as the decoded word information.

Exemplary embodiments of the memory controller and a decoding method will be explained below in detail with reference to the accompanying drawings. The present invention is not limited to the following embodiments.

Figure 1:
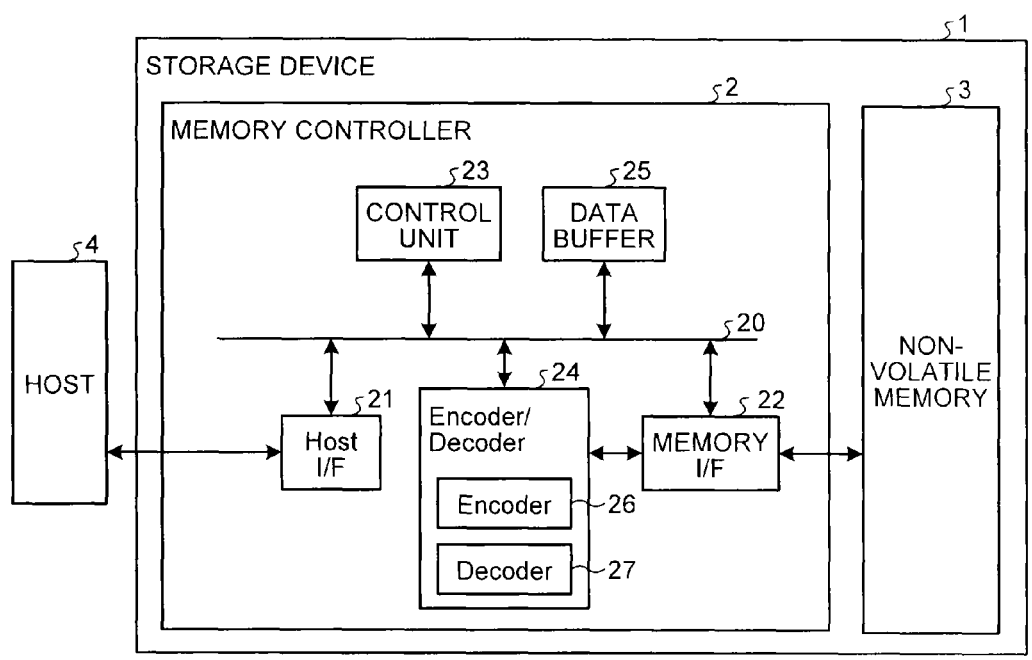
FIG. 1 is a block diagram illustrating an example of a configuration of a storage device according to an embodiment.

FIG. 1 is a block diagram illustrating an example of a configuration of a storage device according to an embodiment. A storage device 1 of the present embodiment includes a memory controller 2 and a non-volatile memory 3. The storage device 1 is connectable to a host 4. In FIG. 1, a state in which the semiconductor storage device 1 is connected to the host 4 is shown. The host 4 is, for example, an electronic device such as a personal computer or a mobile terminal.

The non-volatile memory 3 such as a NAND memory stores data in a non-volatile manner. While the NAND memory is used as the non-volatile memory 3 in this example, a storage other than the NAND memory may be used as the non-volatile memory 3 as well such as a three-dimensional flash memory, an ReRAM (Resistance Random Access Memory), and an FeRAM (Ferroelectric Random Access Memory). Moreover, while a semiconductor memory is used as the storage in this example, error correction processing of the present embodiment may also be applied to a storage device using a storage other than the semiconductor memory.

The storage device 1 may be a memory card in which the memory controller 2 and the non-volatile memory 3 are configured as one package, or may be an SSD (Solid State Drive).

The memory controller 2 controls writing to the non-volatile memory 3 according to a write command (request) from the host 4. The memory controller also controls reading from the non-volatile memory 3 according to a read command from the host 4. The memory controller 2 includes a host I/F (host interface) 21, a memory I/F (memory interface) 22, a control unit 23, an encoder/decoder 24, and a data buffer 25. The host I/F 21, memory I/F 22, control unit 23, encoder/decoder 24, and data buffer 25 are connected by an internal bus 20.

The host I/F 21 performs processing conforming to an interface specification relevant to the host 4, and outputs a command and user data received from the host 4 to the internal bus 20. The host I/F 21 also transmits user data read from the non-volatile memory 3 and a response from the control unit 23 to the host 4. In the present embodiment, data written into the non-volatile memory 3 in response to a write request from the host 4 is called the user data.

The memory I/F 22 performs writing to the non-volatile memory 3 on the basis of an instruction from the control unit 23. The memory I/F 22 also performs reading from the non-volatile memory 3 on the basis of an instruction from the control unit 23.

The control unit 23 has control over each component of the storage device 1. The control unit 23 performs control according to a command when the command is received from the host 4 via the host I/F 21. The control unit 23 instructs the memory I/F 22 to write user data and parity to the non-volatile memory 3 according to the command from the host 4, for example. Moreover, the control unit 23 instructs the memory I/F 22 to read the user data and parity from the non-volatile memory 3 according to the command from the host 4.

When receiving a write request from the host 4, the control unit 23 determines a storage area (memory area) on the non-volatile memory 3 for the user data accumulated in the data buffer 25. That is, the control unit 23 manages a write destination to which the user data is written. The correspondence between a logical address of the user data received from the host 4 and a physical address indicating the storage area in which the user data is stored on the non-volatile memory 3 is stored as an address conversion table.

When receiving a read request from the host 4, the control unit 23 uses the address conversion table to convert a logical address specified by the read request into a physical address and instructs the memory I/F 22 to perform reading from the physical address.

The NAND memory usually performs writing/reading by a data unit called a page and erasing by a data unit called a block. In the present embodiment, a plurality of memory cells connected to the same word line is called a memory cell group. One memory cell group corresponds to one page when the memory cell is a single level cell (SLC). On the other hand, one memory cell group corresponds to a plurality of pages when the memory cell is a multi-level cell (MLC). Each memory cell is connected to the word line and to a bit line. Each memory cell can be identified by an address identifying the word line and an address identifying the bit line. In the present embodiment, writing of one page's worth of data to the same page of the same memory cell group is expressed as writing of data to one page of the non-volatile memory 3.

The data buffer 25 temporarily stores the user data received from the host 4 until the memory controller 2 stores the user data into the non-volatile memory 3. Moreover, the data buffer 25 temporarily stores the user data read from the non-volatile memory 3 until the user data is transmitted to the host 4. The data buffer 25 is formed of a general-purpose memory such as an SRAM (Static Random Access Memory) or a DRAM (Dynamic Random Access Memory).

The user data transmitted from the host 4 is transferred to the internal bus 20 and then stored in the data buffer 25. The encoder/decoder 24 generates a codeword by encoding the data stored in the non-volatile memory 3. The encoder/decoder 24 includes an encoder 26 and a decoder 27. Encoding and decoding of the present embodiment will be described later in detail when writing to the non-volatile memory 3 and reading therefrom are described.

The writing of the present embodiment will be described. When writing data to the non-volatile memory 3, the control unit 23 instructs the encoder 26 to encode data as well as determines a storage location (address of the storage location) of the codeword in the non-volatile memory 3 and instructs the memory I/F 22 about the storage location. On the basis of the instruction from the control unit 23, the encoder 26 encodes the data on the data buffer 25 and generates the codeword. The memory I/F 22 performs control to store the codeword into the storage location on the non-volatile memory 3 instructed by the control unit 23.

The encoder 26 encodes (performs error correction coding on) the user data of a first data length and generates a codeword of a second data length. The encoder 26 can perform encoding by using a BCH (Bose-Chaudhuri-Hocquenghem) code or an RS (Reed-Solomon) code, for example. The following description illustrates an example where the encoder 26 performs encoding by using the BCH code or RS code. In addition to these codes, the encoder 26 may use an LDPC (Low Density Parity Check) code as the error correction code or any error correction code as long as it is a linear code.

Figure 2:
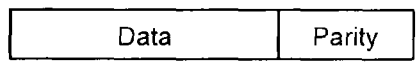
FIG. 2 is a diagram illustrating an example of a configuration of a codeword according to the embodiment.

FIG. 2 is a diagram illustrating an example of a configuration of a codeword according to the present embodiment. In FIG. 2, "Data" indicates the user data of a data length K (first data length). The encoder 26 encodes the user data of the data length K to generate "Parity", and generates a codeword of a code length N (second data length). When control data or the like used in the memory controller 2 other than the user data is protected by the same encoding method as that of the user data, "Data" in FIG. 2 indicates the control data or the like. FIG. 2 illustrates an example of the configuration of the codeword which, in another example, may not be separated into Parity and Data.

Where the storage location of the codeword illustrated in FIG. 2 on the non-volatile memory 3 is not particularly limited, one codeword or a plurality of codewords may be stored in one page, for example. One codeword may be stored across a plurality of pages as well.

Next, the reading from the non-volatile memory 3 performed in the present embodiment will be described. When reading data from the non-volatile memory 3, the control unit 23 specifies an address on the non-volatile memory 3 to instruct the memory I/F 22 to perform reading as well as instruct the decoder 27 to start decoding. The memory I/F 22 reads the codeword from the non-volatile memory 3 according to the instruction from the control unit 23. The codeword being read is input to the decoder 27, or temporarily stored in the data buffer 25 and thereafter read therefrom to be input to the decoder 27. The decoder 27 decodes the codeword read from the non-volatile memory 3.

A decoding method of the codeword that is error correction coded includes hard decision decoding and soft decision decoding. A received word is input as a soft decision value in the soft decision decoding and as a hard decision value in the hard decision decoding.

In the present embodiment, the encoding is performed by using the BCH code or RS code as described above. The codeword generated by the BCH code or RS code can be decoded by not only the hard decision decoding but also the soft decision decoding. The hard decision decoding requires shorter processing time compared to the soft decision decoding, whereas the soft decision decoding has higher error correction ability than the hard decision decoding. Accordingly, in the present embodiment, the hard decision decoding (first decoding) is first performed by reading the codeword from the non-volatile memory 3 as the hard decision value, and when the hard decision decoding fails, the soft decision decoding (second decoding) is performed by reading the codeword from the non-volatile memory 3 as the soft decision value. Alternatively, the soft decision decoding may be performed from the start by reading the codeword from the non-volatile memory 3 as the soft decision value without performing the hard decision decoding.

Figure 3:
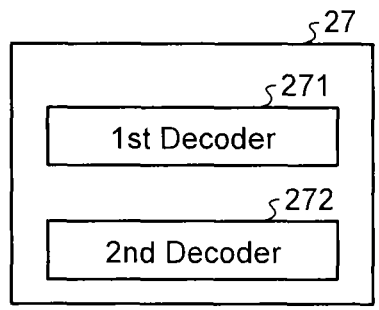
FIG. 3 is a diagram illustrating an example of a configuration of a decoder according to the embodiment.

FIG. 3 is a diagram illustrating an example of a configuration of the decoder 27 according to the present embodiment. The decoder 27 includes a 1st decoder 271 performing the hard decision decoding and a 2nd decoder 272 performing the soft decision decoding.

Figure 4:
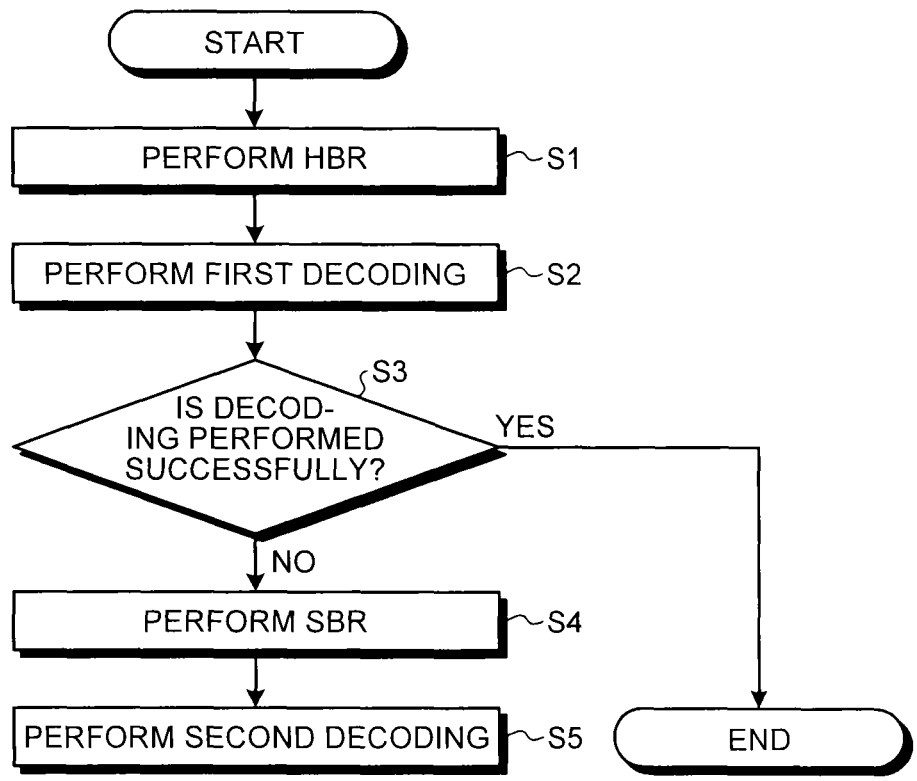
FIG. 4 is a flowchart illustrating an example of a read-out procedure according to the embodiment.

FIG. 4 is a flowchart illustrating an example of a read-out procedure according to the present embodiment. The control unit 23 instructs the memory I/F 22 to read data from the non-volatile memory 3 by hard bit read (HBR) while specifying an address to be read. The memory I/F 22 executes the hard bit read according to the instruction (step S1). The hard bit read is a method of reading each bit constructing the read data as the hard decision value equal to 0 or 1.

When the non-volatile memory 3 is the NAND memory, an electron is injected at the time of writing data such that an electron count (electric charge) at a floating gate corresponds to one of a plurality of distributions (threshold distributions) according to a data value. In order to simplify the description, there will be described an example of storing one bit per cell where one memory cell stores one bit. In the one bit per cell, one of two distributions corresponds to "0" while the other corresponds to "1". When a voltage is applied to the memory cell, a current flows with the application of a voltage that is higher than or equal to a voltage value corresponding to the electric charge of the memory cell, whereas a current does not flow with the application of a voltage that is lower than the voltage value. Accordingly, this threshold voltage is determined for each memory cell according to the electric charge of the memory cell. This voltage determined according to the electric charge of the memory cell is called a threshold voltage (Vth) in this case. The electric charge is injected to correspond to one of the two threshold distributions in an initial state and, at the time of reading, a reference read voltage separating the two threshold distributions is applied to the memory cell in order to determine whether or not the data stored in the memory cell corresponds to "1".

The hard bit read is a method in which the non-volatile memory 3 applies the reference read voltage to the memory cell to determine whether the data stored therein corresponds to "1" or "0", and reads the determined result. The read voltage applied in the hard bit read may be changed from the reference read voltage.

Referring back to FIG. 4, the control unit 23 instructs the decoder 27 to execute the hard decision decoding so that the 1st decoder 271 executes the hard decision decoding (step S2). Specifically, the control unit 23 instructs the decoder 27 to execute the hard decision decoding so that the 1st decoder 271 executes decoding by using the hard decision value read from the non-volatile memory 3. The 1st decoder 271 notifies the control unit 23 whether or not the decoding is successfully executed (error correction is successfully executed) for each codeword.

The control unit 23 determines whether or not the hard decision decoding is successfully executed on the basis of the notification from the 1st decoder 271 (step S3), and ends the reading when the hard decision decoding is successfully executed (step S3: Yes).

When determining that the hard decision decoding is not successfully executed (step S3: No), the control unit 23 instructs the memory I/F 22 to read data from the non-volatile memory 3 by soft bit read (SBR) while specifying an address to be read, so that the memory I/F 22 executes the soft bit read which reads data as the soft decision value (step S4).

Figure 5:
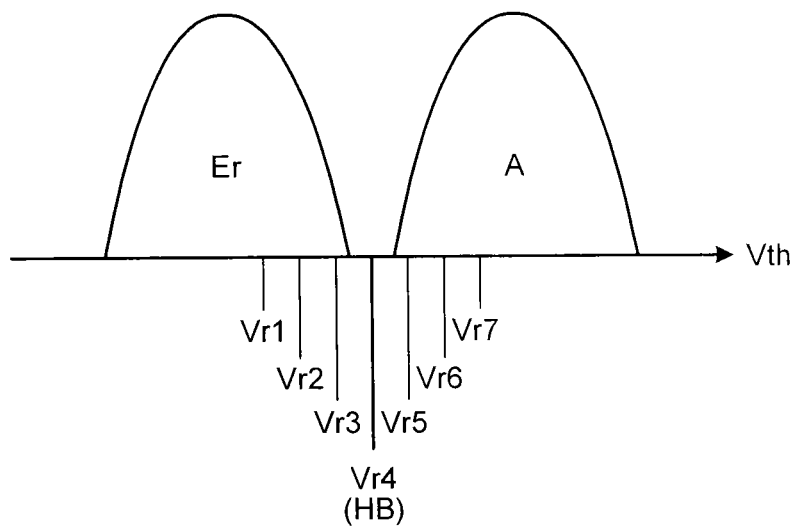
FIG. 5 is a diagram illustrating soft bit read.

FIG. 5 is a diagram illustrating the soft bit read. In FIG. 5, a horizontal axis represents the threshold voltage while a vertical axis represents frequency. FIG. 5 illustrates an example of the single level cell storing one bit per cell, where an Er (Erase) distribution on the left corresponds to the data value "1" while an A distribution on the right corresponds to the data value "0". In addition to the reference read voltage used in the hard bit read, the soft bit read executes reading by using a plurality of read voltages on both sides of the reference read voltage. FIG. 5 illustrates the example where the soft bit read is executed by using the total of seven read voltages. A read voltage indicated as Vr4 (HB) is the reference read voltage used in the hard bit read. The soft bit read performs reading by using the total of seven read voltages including Vr4, Vr1, Vr2 and Vr3 that are lower than Vr4, and Vr5, Vr6 and Vr7 that are higher than Vr4. The number of read voltages is not limited to seven in the soft bit read.

Figure 6:
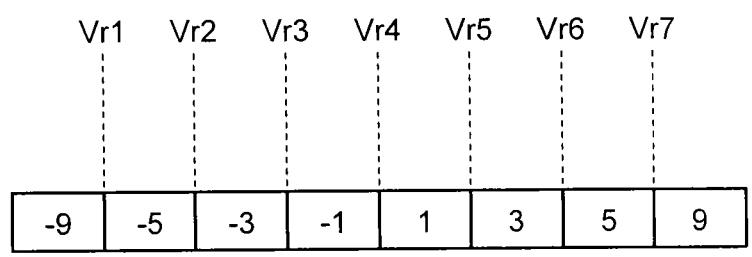
FIG. 6 is a diagram illustrating an example of an LLR table.

Then, for example, an LLR(Log Likelihood Ratio) table can be used to find an LLR from a determination result of whether or not the threshold voltage for each memory cell is higher than or equal to each read voltage. FIG. 6 is a diagram illustrating an example of the LLR table. The LLR equals −9 when the threshold voltage of the memory cell is determined to be lower than Vr1, or equals −5 when the threshold voltage of the memory cell is determined to be Vr1 or higher and lower than Vr2, for example. The LLR table is not limited to the example illustrated in FIG. 6. The LLR may also be found by using a calculation formula without using the LLR table. In the present embodiment, the execution of the soft bit read up to the conversion into the LLR is called the reading of data from the non-volatile memory 3 as the soft decision value.

Either the memory controller 2 or the non-volatile memory 3 may perform the conversion into the LLR by the determination result of whether or not the threshold voltage for each memory cell is higher than or equal to each read voltage. When the conversion is performed by the memory controller 2, the non-volatile memory 3 for example outputs information, for each memory cell, indicating which of eight regions the threshold voltage falls into, the eight regions corresponding to the read voltage lower than Vr1, Vr1 or higher and lower than Vr2, Vr2 or higher and lower than Vr3, Vr3 or higher and lower than Vr4, Vr4 or higher and lower than Vr5, Vr5 or higher and lower than Vr6, Vr6 or higher and lower than Vr7, and Vr7 or higher. The memory I/F 22 then finds the LLR on the basis of the LLR table and the information output from the non-volatile memory 3 and stores the LLR into the data buffer 25.

While FIGS. 5 and 6 illustrate the example of the single level cell storing one bit per cell, the multi-level cell also executes reading by a plurality of read voltages at each boundary of the threshold distribution as with the example of the single level cell. The LLR is then calculated on the basis of the result of reading performed by the plurality of read voltages.

Referring back to FIG. 4, the control unit 23 instructs the decoder 27 to execute the soft decision decoding so that the 2nd decoder 272 executes the soft decision decoding (step S5). The soft decision decoding will be described later in detail.

By performing the processing described above, when the error correction by hard decision decoding can be successful, the decoding is completed upon execution of the hard bit read and hard decision decoding, whereby reading can be performed at high speed. When the error correction cannot be successful by the hard bit read and hard decision decoding, on the other hand, the soft decision decoding having higher correction performance is executed. FIG. 4 merely illustrates one example of the processing, where the soft decision decoding is executed from the start without executing the hard decision decoding when using an LDPC code or the like. Moreover, the soft decision decoding may be executed from the start without executing the hard decision decoding when using the BCH code and RS code, as described above.

The soft decision decoding of the present embodiment will now be described. The encoding performed to obtain a codeword c of a code length N from an information vector u of a length K in a linear block code can be written as uG=c by using a generator matrix G being a K×N matrix. The codeword c generated by using the generator matrix G is received with noise, so that a received word y is possibly different from the original c. A decoding process is required to restore the information vector u from the received word y. In the present embodiment, the codeword c is generated by the encoder 26 of the storage device 1, while the received word y is read from the non-volatile memory 3.

Maximum Likelihood Decoding (MLD) is known as a soft decision decoding method which finds a decoded word with the maximum likelihood c* (expressed by expression (1) below) that is a codeword having the highest probability to be the one from which a received word is generated, namely having the maximum likelihood, from a whole set of codewords C, but the MLD involves a large amount of computation.

$$c^* = {}_{c \in C} \mathrm{argmax} P(y|c) \quad (1)$$

Therefore, in many cases, there is used a method called near MLD which finds a codeword $c^*_{app}$ (expressed by expression (2) below) having the highest probability to be the one from which the received word is generated, from not the whole set of codewords but a subset of codewords C'. The near MLD is used as the soft decision decoding method in the present embodiment. Here, $c^* = c^*_{app}$ holds true when c* is included in C'.

$$c^*_{app} = {}_{c \in C'} \mathrm{argmax} P(y|c) \quad (2)$$

In the linear block code, for example, a codeword series C'={$c_1$, $c_2$, $c_3$, ...} being the subset can be generated by performing calculation of $u_iG'=c_i$ for each bit string by using a bit string series U={$u_1$, $u_1$, $u_2$, ...} and the generator matrix G'. Then, as expressed by expression (2), the codeword $C^*_{app}$ having the highest probability to be the original codeword among the codeword series C' is calculated as the decoded word (decoded codeword).

Figure 7:
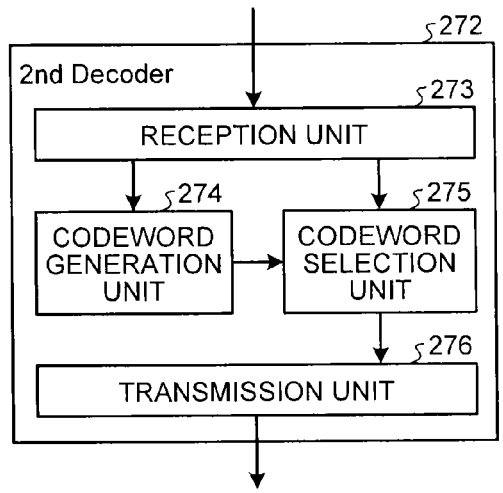
FIG. 7 is a diagram illustrating an example of a configuration of a 2nd decoder according to the embodiment.
Figure 8:
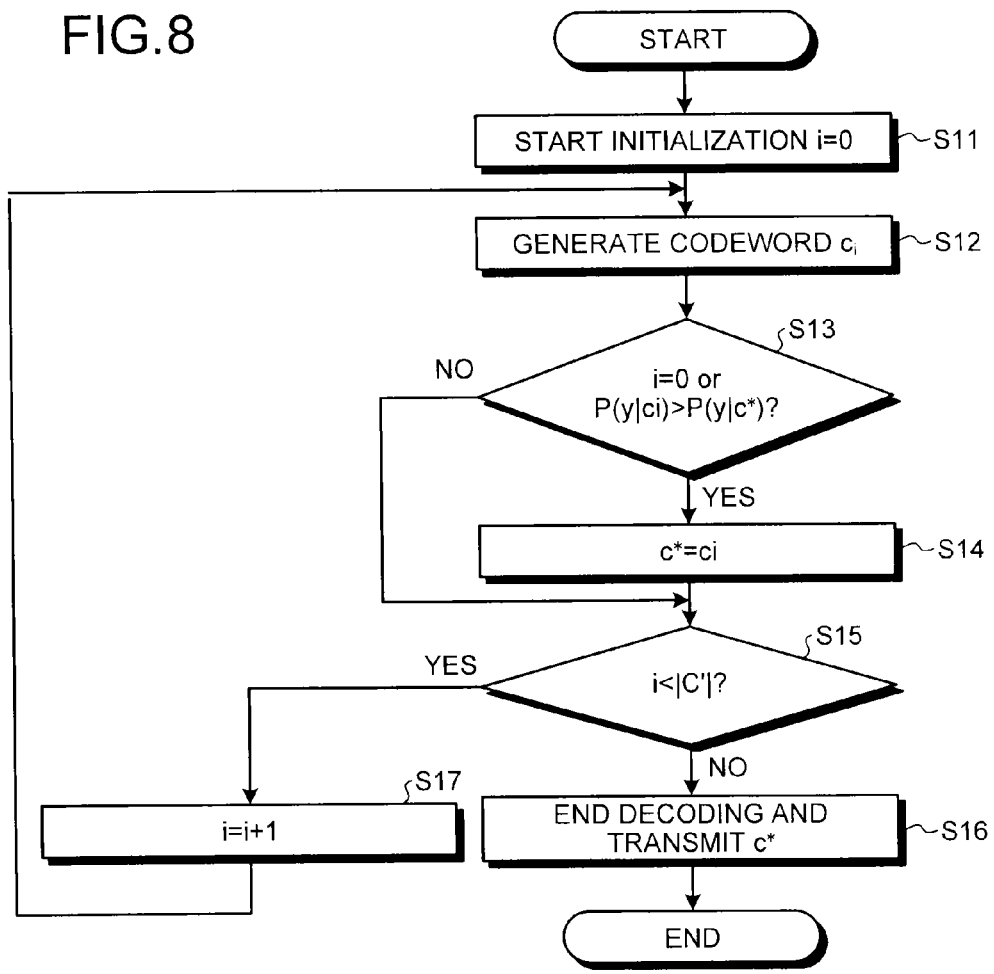
FIG. 8 is a flowchart illustrating an example of an entire procedure of soft decision decoding according to the embodiment.

FIG. 7 is a diagram illustrating an example of a configuration of the 2nd decoder 272 of the present embodiment. As illustrated in FIG. 7, the 2nd decoder 272 includes a reception unit 273, a codeword generation unit (generation unit) 274, a codeword selection unit (selection unit) 275, and a transmission unit 276. FIG. 8 is a flowchart illustrating an example of an entire procedure of the soft decision decoding according to the present embodiment. The entire processing of the soft decision decoding according to the present embodiment will be described with reference to FIGS. 7 and 8. The reception unit 273 of the 2nd decoder 272 receives the received word read from the non-volatile memory 3 as the soft decision value, and then inputs the received word to the codeword generation unit 274 and the codeword selection unit 275.

The codeword generation unit 274 starts initialization and sets an index i to "0", the index indicating the generated codeword (step S11). Next, the codeword generation unit 274 generates a codeword $c_i$ (step S12). A method of generating the codeword $c_i$ will be described later. Then, the codeword selection unit 275 determines whether i=0 or a likelihood P (y|$c_i$) of the codeword $c_i$ is higher than a likelihood P (y|$c^*_{app}$) of the decoded word $c^*_{app}$ having the maximum likelihood among codewords generated before that point (step S13). Assuming additive white Gaussian noise, for example, a value obtained by reversing the sign of an Euclidean distance between the received word y and the codeword $c_i$ can be used as a value proportional to the log of the likelihood P (y|$c_i$).

When the codeword selection unit 275 determines that i=0 does not hold and the likelihood P (y|$c_i$) of $c_i$ is higher than the likelihood P (y|$c^*_{app}$) of $c^*_{app}$ (step S13: Yes), the codeword selection unit 275 updates $c^*_{app}$ with $c_i$ (step S14) and determines whether or not the index i is smaller than the predetermined size of C' (the number of codewords constructing C') |C'| (step S15). The decoding is terminated when the index i is larger than or equal to |C'|, namely when the number of generated codewords (i+1) equals the size of C' (step S15: No), whereby the transmission unit 276 transmits c* as the decoded word (decoded word with approximate maximum likelihood) (step S16). The decoded word transmitted in step S16 is temporarily stored in the data buffer 25. An information bit of the decoded word is then transmitted as the user data to the host 4.

When the codeword selection unit 275 determines in step S13 that i=0 does not hold or the likelihood P (y|$c_i$) of $c_i$ is lower than or equal to the likelihood P (y|c*) of $c^*_{app}$ (step S13: No), the processing proceeds to step S15. The index i is incremented (step S17) when the index i is determined to be smaller than |C'| in step S15 (step S15: Yes), and then the processing returns to step S12.

The method of generating the codeword $c_i$ of the present embodiment will now be described. In order to increase the probability that the decoded word with the maximum likelihood c* is included in the codeword series C', appropriate bit string series U and matrix G' need to be found as variables based on the received word y. Accordingly, the multiplication of a variable vector $u_i$ and a variable matrix G' needs to be performed to calculate $c_i$ (=$u_iG'$). The problem here is the increase in a circuit scale and wiring complexity when mounting hardware that performs computation to generate $c_i$. In the present embodiment, the circuit scale and wiring complexity are reduced by separately calculating a vector determined independently to the received word and a vector determined dependently on the received word in the calculation of the approximate maximum likelihood decoding.

Figure 9:
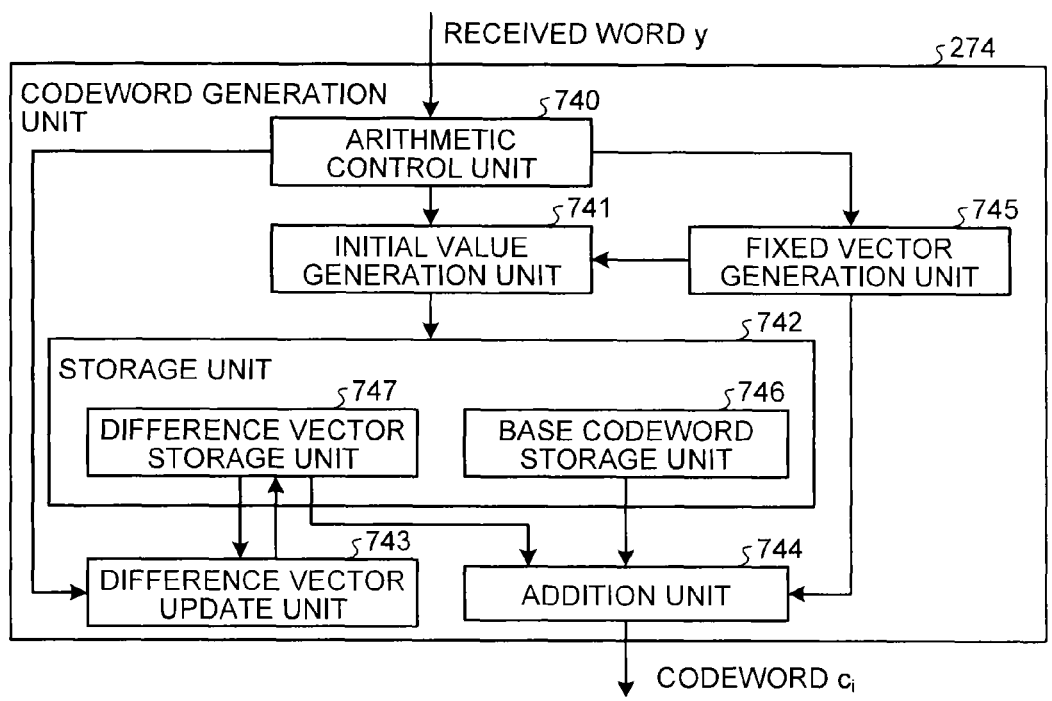
FIG. 9 is a diagram illustrating an example of a configuration of a codeword generation unit according to the embodiment.

FIG. 9 is a diagram illustrating an example of a configuration of the codeword generation unit 274 according to the present embodiment. As illustrated in FIG. 9, the codeword generation unit 274 of the present embodiment includes an arithmetic control unit 740, an initial value generation unit 741, a storage unit 742, a difference vector update unit (update unit) 743, an addition unit (arithmetic unit) 744, and a fixed vector generation unit 745.

Here, the characteristic of the codeword series {$c_i$} that is the subset of codewords on which the present embodiment is predicated will be described. The codeword series {$c_i$} of the present embodiment can be described as $u_iG'=c_i$ by using a vector series {$u_i$} of the length K and the generator matrix G' of the order K×N. The vector series {$u_i$} and generator matrix G' can be found by using the received word y received from the reception unit 273.

Moreover, it is assumed that a vector $u_i$ being each element of the vector series {$u_i$} can be written as $u_i=u+v_i$ by using a vector u of the length K and a vector $v_i$ being each element of a fixed vector series {$v_i$} of the length K that is determined independently to the received word y. At this time, the codeword $c_i$ can be expressed by expression (3) below.

$$c_i = u_iG' = uG' + v_iG' \quad (3)$$

It is further assumed that there holds expression (4) using a K×K-th order unit matrix E and a K×(N−K)-th order matrix G". Note that (α/β) represents a matrix in which a matrix α and a matrix β are arranged in a column direction.

$$G' = (E|G'') \quad (4)$$

Expression (5) holds by setting $v_iG''=d_i$. Here, "0" represents a zero vector.

$$v_iG' = v_i(E|G'') = (v_i|0) + (0|v_iG'') = (v_i|0) + (0|d_i) \quad (5)$$

A vector series $\{d_i\}$ can be expressed by expression (6) by using a linear t-th order recurrence. In the expression, t is an integer equal to one or larger. Expression (6) is called a difference vector update equation.

$$d_i = \sum_{j=0}^{t-1} w_j d_{i-t+j} \text{ where } w_j \in \{0, 1\}, i \geq t \quad (6)$$

By the definition of the linear code, both $uG'$ and $v_iG'$ are codewords. Therefore, the codeword $c_i$ is the sum of the codeword $uG'$ and the codeword $v_iG'=(v_i|0)+(0|d_i)$.

From here on, the codeword $uG'$ will be referred to as a base codeword while the codeword $(v_iG')$ will be referred to as a difference codeword. Moreover, among the difference codewords, a vector $v_i$ determined independently to the received word will be referred to as a fixed vector, while a vector $d_i$ determined dependently on the received word will be referred to as a difference vector. According to these definitions, the fixed vector $v_i$ and the difference vector $d_i$ placed side by side correspond to the difference codeword $v_iG'=(v_i|d_i)$, and the sum of the difference codeword $v_iG'=(v_i|d_i)$ and the base codeword $uG'$ corresponds to the codeword $c_i$ that is a candidate for the decoded word. In other words, the codeword $c_i$ is an addition result of an addition result (first data) between the base codeword $uG'$ (third data) and the fixed vector $v_i$ (fourth data), and the difference vector $d_i$ (second data).

FIG. 10 is a flowchart illustrating an example of a codeword generation procedure according to the present embodiment. The processing illustrated in FIG. 10 corresponds to the processing executed in step S12 of FIG. 8. Upon starting the processing, the arithmetic control unit 740 of the codeword generation unit 274 instructs the fixed vector generation unit 745 to generate the fixed vector, so that the fixed vector generation unit 745 calculates the fixed vector $v_i$ and outputs it to the addition unit 744. Moreover, as illustrated in FIG. 10, the arithmetic control unit 740 of the codeword generation unit 274 determines whether or not the index i equals "0" (step S21). The index i is initialized to "0" at the start of the processing. The processing proceeds to step S23 when the index i is not equal to "0" (step S21: No). When the index i equals "0" (step S21: Yes), the arithmetic control unit 740 instructs the initial value generation unit 741 to generate the base codeword $uG'$ and difference vectors $d_0, d_1, \ldots d_{t-1}$ so that, according to the instruction, the initial value generation unit 741 generates the base codeword and t difference vectors $d_0, d_1, \ldots d_{t-1}$ (step S22). Specifically, the initial value generation unit 741 calculates G' on the basis of the received word received from the reception unit 273 and multiplies G' with the fixed vector u to generate the base codeword $uG'$, which is stored in a base codeword storage unit 746 of the storage unit 742. Note that $v_i$ is the value determined solely by the index i. The initial value generation unit 741 further calculates the t difference vectors $d_0, d_1, \ldots d_{t-1}$ by a certain method (such as by calculating the matrix G" and calculating the product of G" and the fixed vector), and stores the difference vectors in a difference vector storage unit 747 of the storage unit 742. When the initial value generation unit 741 calculates the t difference vectors $d_0, d_1, \ldots d_{t-1}$ by calculating the product of G" and the fixed vector, the fixed vector $v_0, v_1, \ldots v_{t-1}$ may be calculated by the fixed vector generation unit 745 to be output to the addition unit 744 or calculated by the initial value generation unit 741.

Next, the arithmetic control unit 740 determines whether or not the integer t is larger than or equal to the index i (step S23). When it is determined that the index i is larger than or equal to the integer t (step S23: Yes), the difference vector update unit 743 is instructed to update the difference vector and then calculates $d_i$ by using the difference vector update equation (step S24). Specifically, the difference vector update unit 743 uses the t difference vectors stored in the difference vector storage unit 747 to calculate the vector $d_i$ by the difference vector update equation. The difference vector update unit 743 then updates the difference vector storage unit 747 (step S25). The difference vector update unit 743 stores the vector $d_i$ into the difference vector storage unit 747 in this update. At this time, a vector $d_{i-t}$ may be erased from the difference vector storage unit 747. The t difference vectors $d_{i-t+1}, \ldots d_{i-t+2}, \ldots d_i$ are always stored in the difference vector storage unit 747 by updating the difference vector in this manner, so that the difference vector update unit 743 can calculate a new $d_i$ by using the difference vector stored in the difference vector storage unit 747 and the difference vector update equation.

Next, the addition unit 744 calculates $c_i$ by adding $uG'$ stored in the base codeword storage unit 746, output from the fixed vector generation unit 745, and $d_i$ being one of the difference vectors stored in the difference vector storage unit 747, and outputs $c_i$ to the codeword selection unit 275 as a candidate for the decoded word (step S26). When it is determined in step S23 that the index i is smaller than the integer t (step S23: No), the processing proceeds to step S26.

As a result, a new candidate for the decoded word can be generated by calculating the sum of the vectors with use of the codeword generation unit 274 of the present embodiment. The present embodiment can therefore reduce the wiring complexity, power consumption, and circuit scale compared to a circuit in which $c_i$ being a new candidate for the decoded word is calculated by repeating the multiplication of the variables of the variable vector $u_i$ and variable matrix G' stored on a register.

While the codeword series can be expressed by expressions (3), (4), and (6) as a precondition in the aforementioned description, the characteristic of the codeword series is not limited to the characteristic expressed in expressions (3), (4), and (6). A configuration similar to the codeword generation unit of the present embodiment can be used to bring about the same effect as that of the present embodiment, when the codeword series being the candidate for the decoded word can be expressed by the sum of a term satisfying a recurrence relation similar to expression (6) and another term by using an equation similar to expression (3).

While the fixed vector generation unit 745 is adapted to output the generated fixed vector $v_i$ to the addition unit 744 in the present embodiment, the generated fixed vector $v_i$ may instead be stored in the storage unit 742 temporarily. The addition unit 744 may then be adapted to add $uG'$, $v_i$ stored in the storage unit 742, and $d_i$ being one of the difference vectors stored in the difference vector storage unit 747 to calculate $c_i$.

Moreover, in the aforementioned example, the codeword generation unit 274 is adapted to calculate and output $c_i$ being the candidate for the decoded word, namely output the decoded word itself as the decoded word information indicating $c_i$ that is the candidate for the decoded word, but it may instead be adapted to only output information required to uniquely specify $c_i$. The codeword generation unit 274 for example may output not $c_i$ but only a difference (error position vector) between the received word y and the decoded word candidate $c_i$ or a sequence (error position number string) recording an index of a non-zero element of the error position vector as the decoded word information indicating the decoded word. Likewise, the difference vector storage unit 747 may store only an index indicating the non-zero element among the difference vectors. This can bring about the effect that the amount of information stored in the codeword generation unit 274 is compressed to reduce the memory required for circuit construction.

While there has been described the example where the 2nd decoder 272 performs decoding by using the soft decision value as the input, the aforementioned configuration and operation of the 2nd decoder 272 can be used to perform decoding which uses the hard decision value as an input as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising a decoder configured to perform approximate maximum likelihood decoding of a linear code on a received word, the received word being read from a non-volatile memory,
the decoder including:
a generation unit configured to output a plurality of decoded word information on the basis of the received word, each of the plurality of decoded word information identifying each of a plurality of decoded word being a candidate for a decoded result of the received word; and
a selection unit configured to select a decoded word with the maximum likelihood from among the plurality of decoded words,
the generation unit including:
an initial value generation unit configured to calculate first data on the basis of the received word;
a storage unit configured to store the first data and a predetermined number of second data;
an update unit configured to calculate new second data by using the predetermined number of second data stored in the storage unit and update the predetermined number of second data stored in the storage unit with the new second data; and
an arithmetic unit configured to add the first data and the latest second data stored in the storage unit and output a result of the addition as the decoded word information.

2. The memory controller according to claim 1, wherein the first data is an addition result of third data calculated on the basis of the received word and fourth data generated on the basis of an index indicating the decoded word to be generated.

3. The memory controller according to claim 1, wherein the update unit calculates the new second data by using a linear recurrence on the basis of predetermined number of second data stored in the storage unit.

4. The memory controller according to claim 1, wherein the decoded word information is the decoded word.

5. The memory controller according to claim 1, wherein the decoded word information is information indicating a difference between the received word and the decoded word.

6. The memory controller according to claim 1, wherein the linear code is a Bose-Chaudhuri-Hocquenghem code.

7. The memory controller according to claim 1, wherein the linear code is a Reed-Solomon code.

8. A storage device comprising:
a non-volatile memory;
a memory interface configured to read a received word from the non-volatile memory; and
a decoder configured to perform approximate maximum likelihood decoding of a linear code on the received word,
the decoder including:
a generation unit configured to output a plurality of decoded word information on the basis of the received word, each of the plurality of decoded word information uniquely identifying each of a plurality of decoded word being a candidate for a decoded result of the received word; and
a selection unit configured to select a decoded word with the maximum likelihood from among the decoded words on the basis of the decoded word information,
the generation unit including:
an initial value generation unit configured to calculate first data on the basis of the received word;
a storage unit configured to store the first data and a predetermined number of second data;
an update unit configured to calculate new second data by using the predetermined number of second data stored in the storage unit and update the predetermined number of second data stored in the storage unit with the new second data; and
an arithmetic unit configured to add the first data and the latest second data stored in the storage unit and output a result of the addition as the decoded word information.

9. The storage device according to claim 8, wherein the first data is an addition result of third data calculated on the basis of the received word and fourth data generated on the basis of an index indicating the decoded word to be generated.

10. The storage device according to claim 8, wherein the update unit calculates the new second data by using a linear recurrence on the basis of predetermined number of second data stored in the storage unit.

11. The storage device according to claim 8, wherein the decoded word information is the decoded word.

12. The storage device according to claim 8, wherein the decoded word information is information indicating a difference between the received word and the decoded word.

13. The storage device according to claim 8, wherein the linear code is a Bose-Chaudhuri-Hocquenghem code.

14. A decoding method which performs approximate maximum likelihood decoding of a linear code on a received word read from a non-volatile memory, the method comprising:

calculating first data on the basis of the received word;

storing the first data and a predetermined number of second data into a storage unit;

performing second data calculation processing of calculating new second data by using a predetermined number of second data stored in the storage unit;

updating the predetermined number of second data stored in the storage unit with the new second data;

adding the first data and the latest second data stored in the storage unit and outputting an addition result as a decoded word information; the decoded word information uniquely identifying each of a plurality of decoded words, each of the plurality of decoded words being a candidate for a decoded result of the received word; and selecting, as a decoded result, a decoded word with the maximum likelihood from among the plurality of decoded words on the basis of a plurality of the decoded word information.

15. The decoding method according to claim 14, wherein the first data is the sum of third data calculated on the basis of a received word and fourth data generated on the basis of an index indicating the decoded word to be generated.

16. The decoding method according to claim 14, wherein the second data calculation processing is calculating the new second data by using a linear recurrence on the basis of predetermined number of second data stored in the storage unit.

17. The decoding method according to claim 14, wherein the decoded word information is the decoded word.

18. The decoding method according to claim 14, wherein the decoded word information is information indicating a difference between the received word and the decoded word.

19. The decoding method according to claim 14, wherein the linear code is a Bose-Chaudhuri-Hocquenghem code.

20. The decoding method according to claim 14, wherein the linear code is a Reed-Solomon code.

* * * * *